United States Patent [19]

Tanaka

[11] 4,023,107
[45] May 10, 1977

[54] SEQUENTIAL CHANNEL TUNING SYSTEM WITH A MEMORY

[75] Inventor: Akio Tanaka, Chicago, Ill.

[73] Assignee: Zenith Radio Corporation, Glenview, Ill.

[22] Filed: Oct. 14, 1975

[21] Appl. No.: 621,911

[52] U.S. Cl. .............................. 325/464; 325/455; 325/468; 334/15

[51] Int. Cl.² .................................. H04B 1/26

[58] Field of Search ... 325/452, 453, 455, 451–459, 325/464, 465, 468–470; 334/11, 14–16

[56] References Cited

UNITED STATES PATENTS

| | | | |
|---|---|---|---|
| 3,748,645 | 7/1973 | Kawashima | 325/468 |
| 3,845,394 | 10/1974 | Hamada | 325/464 |
| 3,864,637 | 2/1975 | Kanow | 325/470 |
| 3,931,579 | 1/1976 | Ma et al. | 325/464 |
| 3,940,702 | 2/1976 | Yoshimura et al. | 325/470 |
| 3,955,145 | 5/1976 | Kawashima | 325/468 |

*Primary Examiner*—Benedict V. Safourek
*Assistant Examiner*—Jin F. Ng
*Attorney, Agent, or Firm*—Nicholas A. Camasto

[57] ABSTRACT

An all-channel two mode television tuning system includes a presettable counter for deriving the number of a receivable television channel by counting the local oscillator frequency. The frequency is varied by a ramp voltage circuit under the control of a comparator which adjusts the tuning based upon the difference between the derived channel number and a desired channel number sequentially generated by externally activated channel counters. A 82 × 1 bit read/write memory is addressed in the first or program mode by the generated channel number to provide locations for storage of signals for tuning to preselected channels. In the second or operate mode logic circuitry interrupts the advancement of the channel counters whenever a generated channel number corresponds to a preselected channel number.

4 Claims, 2 Drawing Figures

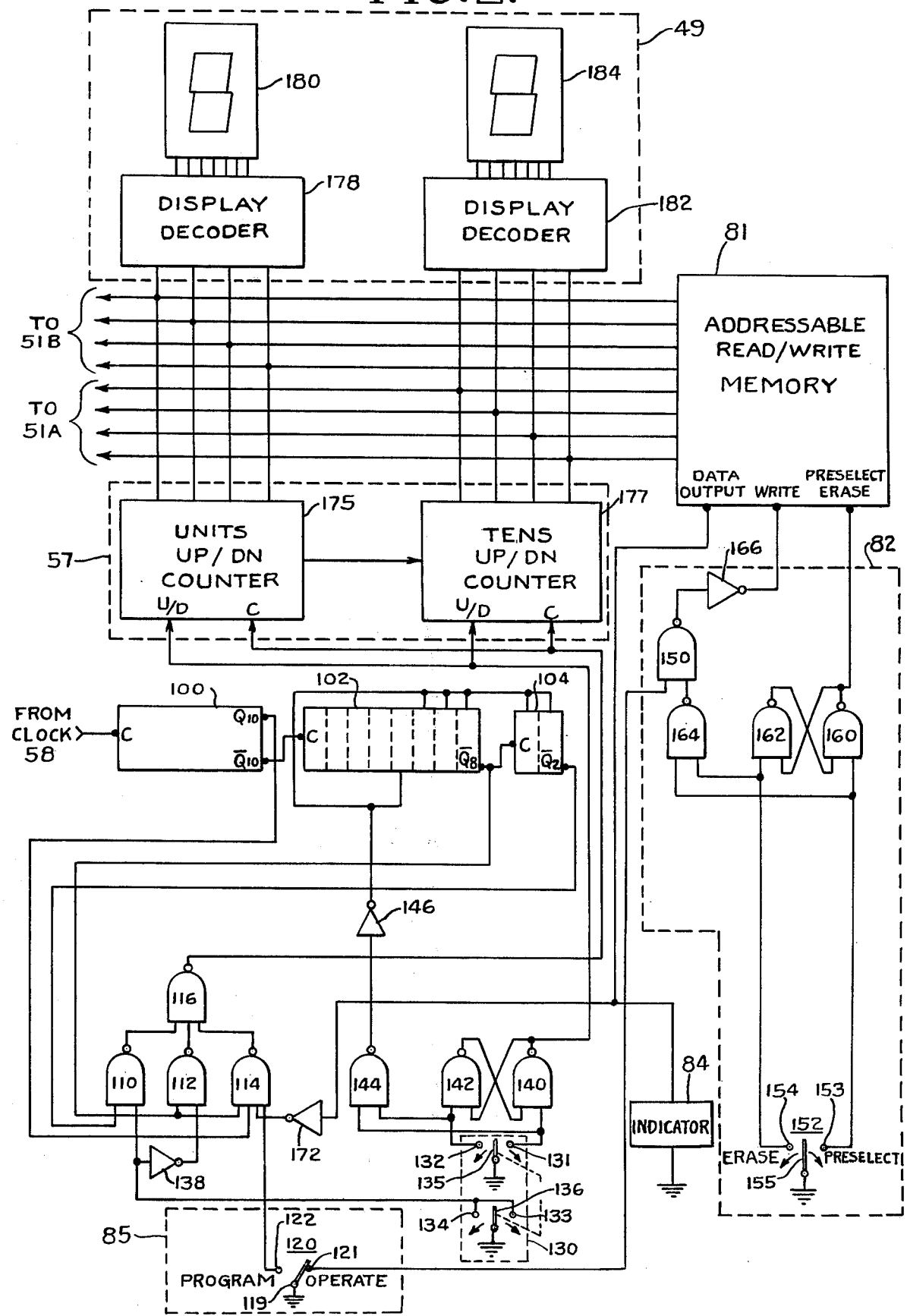

SEQUENTIAL CHANNEL TUNING SYSTEM WITH A MEMORY

CROSS REFERENCE TO RELATED PATENT APPLICATIONS

This application is related to U.S. Pat. No. 3,851,254 issued Nov. 26, 1974 entitled "Digital Systems and Method for Determining and Displaying a Television Channel Number", in the names of Richard G. Merrell and Akio Tanaka. This application is also related to the following applications all of which are assigned to the assignee of the present application and all of which are hereby incorporated by reference. Ser. No. 430,446, filed Jan. 3, 1974, now U.S. Pat. No. 3,961,266 issued June 1, 1976, entitled "Channel Seeking Tuning System" in the name of Akio Tanaka, Ser. No. 457,010, filed Apr. 1, 1974, now U.S. Pat. No. 3,931,579 issued Jan. 6, 1976, entitled "Digital Signal Seeking Tuning System", in the names of John Ma and Akio Tanaka and Ser. No. 466,579, filed May 3, 1974, now U.S. Pat. No. 3,946,319 issued Mar. 23, 1976, entitled "All Electronic Digital Tuner System with Memory" in the names of John Ma and Akio Tanaka.

BACKGROUND OF THE INVENTION

The invention is particularly related to the form of television tuning systems which selectively tune to desired television channels by deriving channel number information indicative of the system tuning and adjust the tuning as a function of the difference between the derived and desired channel number information. Such systems are relatively new. U.S. Pat. No. 3,961,266 discloses a television tuning system which employs a comparator for comparing the asynchronously sampled local oscillator frequency, encoded in terms of channel numbers and a modular residue corresponding to intrachannel fractions, with encoded input channel number information. A voltage ramp drives the tuner until a condition of equality exists between the derived and desired channel numbers and the modular residue (modulo 6) is within prescribed limits. This tuning system not only provides equal access all-channel tuning but also includes a channel recall or memory system.

The memory system is completely described in the above-mentioned U.S. Pat. No. 3,961,266 and is additionally disclosed and claimed in above mentioned U.S. Pat. No. 3,946,319. The memory may be programmed in any desired sequence to provide sequential tuning among a selected group of channels. The advantages of such a tuning system with a memory are readily apparent since the viewer can sequence through only desired channels. The memory has sufficient capacity to hold the digits of the desired channel number normally in binary encoded decimal form. Eight bits of information are used in the memory for each desired channel.

U.S. Pat. No. 3,931,579 discloses a television tuning system which also derives channel number information from the local oscillator frequency and compares this with desired channel number information. Rather than requiring a channel number input it includes channel counters operating sequentially to generate desired channel numbers. As each channel number is generated the system responds by tuning to that frequency location. Additional means are included to determine if a broadcast signal is present at the channel location. If no signal is present the next sequential channel number is generated and the process repeated. If, however, a broadcast signal is detected the generation of sequential channel numbers is interrupted.

The above use of channel counters to generate channel number information greatly simplifies the tuning system for the viewer. He need only touch a single button corresponding to advancing the counters to higher or lower channel numbers to provide tuning. It is not necessary that he enter a 2 digit channel number at a keyboard. Although generating channel numbers is very convenient no provision is made for storing tuning information. Such television systems lack a convenient method of selecting from all possible channels only those channels which the viewer desires. Although a memory of the type which could store individual binary encoded channel number digits could be added to such a system, this addition would cause a considerable increase in cost because of the magnitude of information which must be stored.

The present invention relates to a novel apparatus and method of predetermining a sequence of channel numbers for use in tuning systems of the derived-desired channel number comparison type which sequentially generate channel numbers. It includes a memory with a capacity which, at maximum, can accommodate information related to the preselection of the total number of allocated television channels. This new and novel tuning system combines the features of automatically sequencing through all channel numbers with the option of selecting a smaller number of television channels for convenient or more frequent viewing. Because the tuning system does not store actual tuning information for its operation, the memory need only contain signals corresponding to preselected channels. Thus, the system operation is simplified and a less expensive memory may be utilized.

OBJECTS OF THE INVENTION

An object of this invention is to provide a novel tuning system.

Another object of this invention is to provide an improved indirect tuning system which permits tuning with preselectable channel sequencing.

SUMMARY OF THE INVENTION

An all electronic television tuning system selectively tunes to desired channels among all channels in the television band by deriving channel number information indicative of system tuning and responding to differences between derived channel number information and generated channel number information for adjusting system tuning as a function thereof. The tuning system includes channel selection means generating sequential channel number information for all television channels, channel designation means for preselecting specific generated channel number information corresponding to desired channels and stopping means for interrupting the generation of sequential channel number information whenever the generated channel number information corresponds to preselected channel number information.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings, in the several figures of which like reference numerals identify like elements, and in which:

FIG. 2 shows the detailed circuitry of blocks 80, 81, 82, 83, 84 and 85 of FIG. 1.

DESCRIPTION OF THE PREFERRED EMBODIMENT

Figure 1:
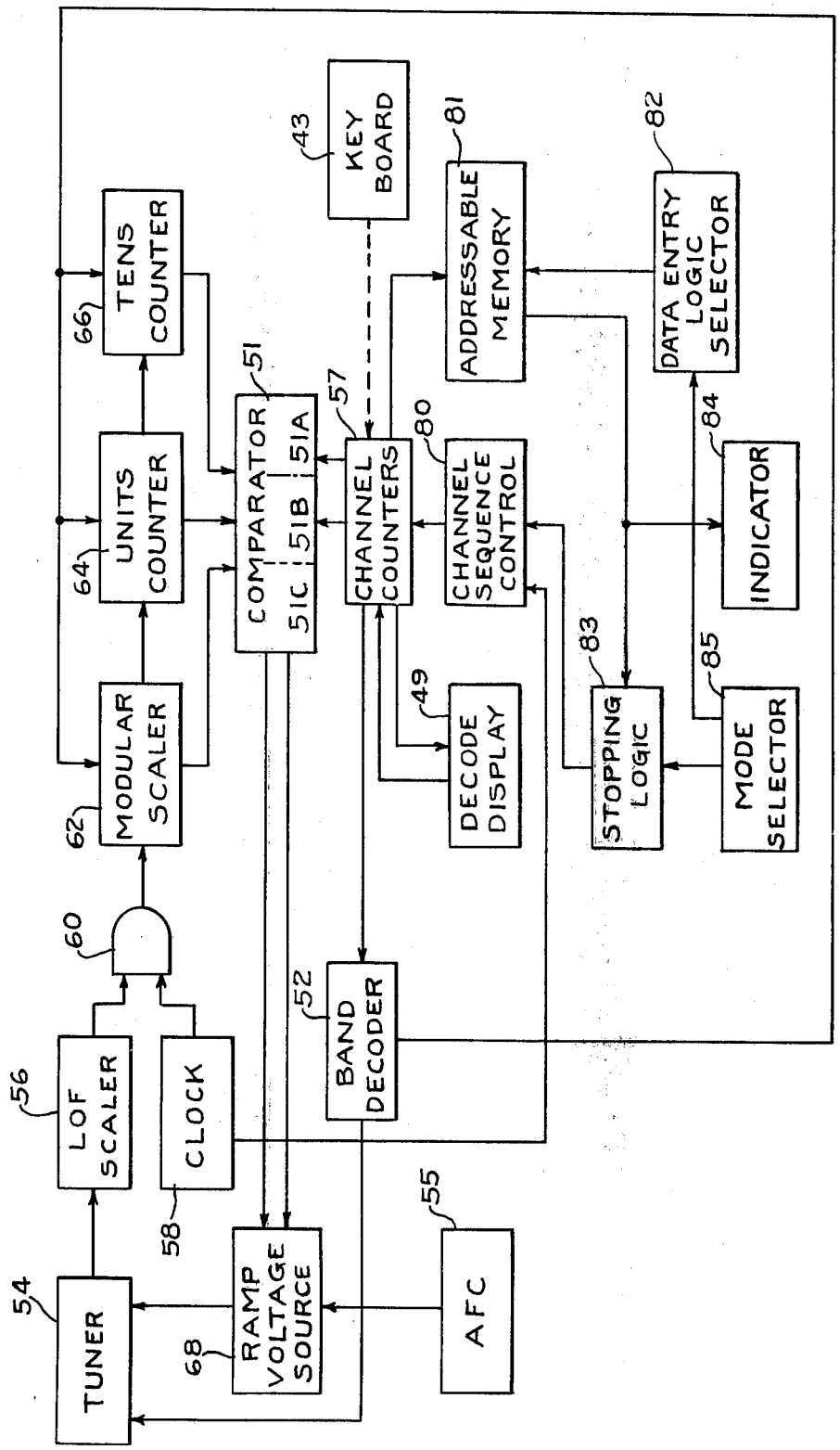
FIG. 1 depicts, in block diagram form, a tuning system employing the invention.

The preferred embodiment comprises circuitry for a bimodal television tuning system using channel counters to generate sequential channel numbers with the tuning system responding by tuning to the corresponding television channel. Of particular interest in the preferred embodiment of the invention is the operation of an addressable read/write memory. The generated channel numbers are made to correspond to unique locations or addresses in the memory. In the system program mode, additional circuitry allows the storing of a 1 or 0 logic level at that memory location to indicate respectively preselection or non-preselection of the corresponding channel number. As additional channel numbers are generated additional signals can be stored in the memory at corresponding locations to preselect any number of desired channels.

In the operate mode, the addressable read/write memory is interrogated at each location to determine if the corresponding channel number has been preselected. If the logic level at the corresponding memory location is at 1, the channel number has been preselected and the channel counter sequential generation of channel numbers is interrupted with the system tuning to that preselected channel. If the logic level at a location is 0 or when the viewer reactivates the switch to cause advancement of the channel counters, the counters advance at a high speed until arriving at the next preselected channel.

Practically speaking, the viewer sets the receiver to the program mode and sequences the channel number counters until a desired television channel signal is received. He then sets the memory (by simply pushing a button) and sequences the counters to the next desired channel number, whereupon he again sets the memory appropriately. After programming the receiver to receive all desired channels, the receiver is placed in the operate mode. Thereafter in response to an Up or Down command (either by a push button or by remote control) the receiver channel counters operate until the next preselected channel number in the memory is generated. Thus, only those preselected channel signals are receivable in the operate mode.

FIG. 1 is a block diagram depicting a tuning system constructed in accordance with the invention. A clock pulse generator 58 supplies a train of regularly spaced pulses to a channel sequence control 80 which divides down the signal to provide various timing pulse and includes the logic gates for applying these timing pulses to channel counters 57. Channel counters 57 generate channel numbers and supply information directly to a comparator 51. A decode display unit 49 provides a visual indication of the generated channel number and is coupled directly to the output of channel counters 57. An additional output of channel counters 57 is coupled to an addressable memory 81 which contains a plurality of addressable locations. The generated channel numbers of channel counters 57 are employed to address the various locations of memory 81. The information stored at each of the addressable locations of memory 81 is determined by data entry logic selector 82. The output of addressable memory 81 is coupled to an indicator 84 to provide a visual display when the preselected channel number corresponds to the generated channel number. Addressable memory 81 is also coupled to stopping logic 83 which is coupled to channel sequence control 80. Channel sequence control 80 advances pulses to channel counters 57 for tuning and displaying the generated channel number and to address unique memory locations in addressable memory 81. A mode selector 85 is coupled to both a stopping logic circuit 83 and to a data entry logic selector 82. The position of mode selector 85 determines the system mode and, during the program mode, stopping logic 83 is disabled and data entry logic selector 82 is enabled to permit entry of data into the memory locations. In the operate mode, data entry logic selector is disabled and stopping logic 83 is enabled to interrupt the advancement of channel counters 57 when the generated channel number corresponds to a preselected number. A keyboard 43 is connected by a broken line as an optional connection to channel counters 57 which would permit tuning to a specific channel by presetting channel counters 57 to the desired channel number.

Another output of channel counters 57 is connected to a band decoder 52 which determines, from the encoded channel information in channel counters 57, (1) in which of the several discontinuous frequency bands the selected channel is; (2) which of UHF or VHF circuitry in the tuner is activated; and (3) the preset information supplied to the channel computing means for decoding of the oscillator frequency. Thus, an output of band decoder 52 is connected to a varactor tuner 54 and another output is connected in common to a modular scaler 62, a units counter 64 and a tens counters 66. A conventionally derived automatic frequency control voltage source (AFC) 55 is coupled to a ramp voltage source 68 for maintaining the oscillator frequency tuned to the received signal picture carrier frequency.

The output of a local oscillator frequency (LOF) scaler 56 and the output of clock pulse generator 58 are coupled to the inputs of a logic gate 60. The signal on the output of gate 60 constitutes the tuning information and comprises a train of oscillator frequency-related pulses in fixed time intervals. The oscillator frequency is determined by counting the number of pulses in an interval. The output of logic gate 60 is connected to modular scaler 62 which, in turn, is connected to units counter 64 which, in turn, is connected to tens counter 66. On a time sample basis, the tuning information is supplied to the appropriately preset modular scaler and units and tens counters which determine the channel number corresponding to the television frequency to which the tuner is tuned. The circuitry from the LOF scaler to the comparator constitutes the channel computing means.

The outputs of modular scaler 62 and counters 64 and 66 are connected to a comparator 51 which has a modular section 51C, a units section 51B and a tens section 51A. Sections 51B and 51A are also supplied the desired or selected channel number from channel counter 57. The derived (computed) channel number is compared with the desired channel number and signals dependent upon the condition of comparator 51 are coupled to ramp voltage source 68 for controlling both the tuning voltage direction and rate of change. The output voltage from ramp voltage source 68 drives tuner 54 to make corrective changes in its local oscillator frequency, until comparator 51 indicates equality between the derived channel number and desired channel number.

DEFINITIONS

For simplicity, only logic connections are shown in the figures and only voltage sources and grounds necessary to establish the logic control signal levels are shown. Positive logic is used throughout and logic gates are simply referred to by their function names, i.e., AND, NAND, OR and NOR, without the word "gate". A 1 represents a high logic (or signal voltage) level and a 0 corresponds to a low logic level. Thus, an AND gate has its output at 1 only if all inputs are at 1; a NAND gate has its output at 0 only if all inputs are at 1; an OR gate has its output at 1 if any input is at 1; and a NOR gate has its output at 0 if any input is at 1. Inverters function to interchange the 1 and 0 levels.

The terms "input" and "output" generally indicate the device terminal unless signal is specified. The term "inhibit" indicates the condition in which a gate output is no longer dependent upon signals applied to its remaining inputs. The term "enable" designates the condition in which a gate output is dependent upon the signals applied to the remaining inputs.

The IC implementation for the logic circuit of the preferred embodiment is CMOS which designates complimentary symmetry-metal oxide semiconductor. Complimentary symmetry is a design arrangement in which N and P channel devices are symmetrically combined so that there is an active pull up and pull down effect on the output signal. MOS describes the form of fabrication of the various layers which constitute the electronic devices.

In FIG. 2 clock 58 is connected to the C terminal of a first flip/flop of a dividing circuit 100 which consists of 10 JK CMOS flip/flops connected in series, with the J and K terminals coupled to a voltage source to establish them at a 1 level. JK flip/flops have two conditioning inputs and one clock input and the response of the device depends upon the states of the conditioning inputs immediately prior to receiving a clock pulse. If both conditioning inputs (J & K) are at 0, the flip/flop will remain in its present state when a clock pulse is received; if the J input is at 1 and the K at 0, the flip/flop will go to the 1 condition; if the J is at 0 and the K at 1, the flip/flop will go to the 0 condition; if both J and K are at 1, the flip/flop will go to the complement or opposite state. The interconnection of flip/flops to provide binary counting is well known in the art and the numerical divisor for this series of flip/flops constituting dividing circuit 100 is 1024. The Q terminal of the 10th flip/flop of dividing circuit 100 is coupled to a first input of a NAND 114 and its $\overline{Q}$ terminal is coupled to the C terminal of a first flip/flop of dividing circuit 102.

Dividing circuit 102 consists of 8 flip/flops arranged for binary counting in the same manner as dividing circuit 100 and has a numerical divisor of 256. The binary counting interconnections for dividing circuit 102 are also well known in the art. The $\overline{Q}$ terminal of the eighth flip/flop of dividing circuit 102 is coupled to a first input of a NAND 112, a second input of a NAND 114 and to the C terminal of the first flip/flop of dividing circuit 104. Dividing circuit 104 consists of two JK flip/flops which are interconnected in the same manner as dividing circuits 100 and 102 providing additional binary counting with a numerical divisor of 4. The $\overline{Q}$ terminal of the second flip/flop is coupled to a first input of a NAND 110.

The outputs of NAND's 110, 112 and 114 are coupled to the inputs of a NAND 116. The output of NAND 116 is coupled to the C terminals of a tens counter 177 and a units counter 175 which are enclosed by a dash line box and designated channel counters 57. A program/operate switch 120 having a grounded contactor 119 is shown positioned for the operate mode. Contactor terminal 121 is coupled to a first input of a NAND 150 and contactor terminal 122 is coupled to a third input of NAND 114.

Momentary switch 130 shown enclosed by a broken line box has a terminal 131 coupled to a first input of a NAND 140 and to the first input of a NAND 144. A terminal 132 is coupled to a first input of a NAND 142 and to a second input of NAND 144. Terminals 133 and 134 are connected together and to the input of an inverter 138 and a second input of NAND 110. The output of inverter 138 is coupled to a second input of NAND 112. Although shown as separate switches a broken line couples grounded contactors 135 and 136 to indicate a mechanical connection. When pressure is applied to momentary switch 130 contactor 135 will make contact with either of terminals 131 or 132. As additional pressure is applied contactor 136 will make contact with corresponding terminals 133 or 134. This additional pressure on this switch in the preferred embodiment causes faster sequencing of channel counters 57.

NAND's 140 and 142 are cross connected to form an RS flip/flop. An RS flip/flop has only set (S) and reset (R) inputs. For the preferred embodiment, a 0 at the S terminal causes the output of the flip/flop to be at 1; a 0 at the R terminal causes the output to be at 0. A 0 at both the R and S results in an indeterminate state which is generally not allowed to occur. The output of NAND 142 is coupled to a second input of NAND 140 and the output of NAND 140 is coupled to a second input of NAND 142. The output of NAND 140 is coupled to the U/D terminals of units counter 175 and tens counter 177. The state of the NAND's 140 and 142 RS flip/flop arrangement establishes the counting direction of the tens and units counters by providing either a 1 or 0 voltage level.

NAND 144 is coupled through an inverter 146 to the fifth, sixth, seventh and eighth flip/flops of dividing circuit 102 and to both flip/flops of dividing circuit 104. The normal 0 signal at the output of NAND 144 is inverted to force a particular preset state into the dividing circuits 102 and 104 to provide a time delay. Forcing a present effectively disables the counting action of dividing circuits 102 and 104.

To insure the relative logic levels in FIG. 2, switch terminals 121, 122, 131, 132, 133, 134, 153, 154 are coupled through a resistor to a source of voltage to establish them at a 1 level. When in direct contact with ground these terminals will be at a 0 level.

A momentary contact switch 152 has a grounded contactor 155, a preset terminal 153 coupled to a first input of a NAND 160 and to a first input of a NAND 164, and an erase terminal 154 coupled to a first input of a NAND 162 and to a second input of NAND 164. NAND's 160 and 162 are cross connected in the form of an RS flip/flop with the output of NAND 162 coupled to a second input of NAND 160 and the output of NAND 160 coupled to a second input of NAND 162. The output of NAND 160 is also coupled to the preselect/erase terminal of a read/write memory 81 and provides 0 and 1 voltage levels as the information for storage at the addressable locations. The output of NAND 164 is coupled to a second input of NAND 150. The output of NAND 150 is coupled through an inverter 166 the write terminal of read/write memory 81 for enabling the storing information at the various addressable locations. Channel counters 57 address particular locations in read/write memory 81 but no data may be stored until the write terminal is enabled. Memory 81 has a data output terminal coupled to an indicator 84 which is also coupled to ground and through an inverter 172 to a fourth input of NAND 114.

Units counter 175 is coupled to tens counter 177 to provide proper advancement of the tens counter for the 9-0 transition in the units counter. The units and tens counters each comprise well known binary counters and provide an encoding of the channel number digits. The output terminals of units counter 175 are coupled to a display decoder 178, to the address terminals of read/write memory 81 and to comparator 51B; the output terminals of tens counter 177 are coupled to a display decoder 182, to the address terminals of read/write memory 81 and to comparator 51A. Display decoder 178 is coupled to a display device 180 and, similarly, display decoder 182 is coupled to a display device 184 providing translation of the binary encoded channel number for a visual representation of the channel number. These are enclosed by a broken line and represent reference number 49 of FIG. 1.

Clock 58 supplies a series of timing pulses at a frequency approximately 2MHz. The numeric divisors for dividing circuits 100, 102 and 104 provide divided down timing pulses at the approximate frequencies of 2KHz, 8Hz and 2Hz respectively. These three frequencies of timing pulses provide three different speeds for the sequencing of channel counters 57. The output of NAND 144 is normally at 0. When momentary contact switch 130 is actuated, either terminal 131 or 132 is grounded causing the output at NAND 144 to be at 1 for as long as the switch is maintained in that position. This 1 level signal is inverted by inverter 146 and releases the last four flip/flops of dividing circuit 102 and both flip/flops of dividing circuit 104 from their normally forced preset condition.

When the switch is released the flip/flops are no longer disabled and initially a particular binary configuration with the states of the first 14 flip/flops being ignored. Clock 58 continues to supply pulses to the dividing circuits and when all of the flip/flops go from the 1 to the 0 state the counting pulse for channel counters 57 is produced. This preset arrangement is arbitrary and provides a time delay before counting the clock signal to produce sequencing of channel counter 57. The length of the time delay is chosen to establish stabilization of all signals to prevent contact bounce.

NAND's 110, 112, 114 and 116 constitute a NAND-NAND cascade arrangement which could be logically identical to a series of AND gates coupled to an OR. At the occurrence of all one level signals at the inputs of any of NAND's 110, 112, and 114, the output from NAND 116 will also be at one. NAND 110 accepts signal from dividing circuit 104 which corresponds to the approximate 2Hz counting frequency. NAND 112 accepts the signal from dividing circuit 102 which corresponds to the approximate 8Hz counting frequency. Both NAND 110 and 112 in the alternative pass the timing pulses through NAND 116 for advancement of the channel counters.

It should be noted that terminals 133 and 134 of momentary switch 130 are normally at a 1 level which enables NAND 110 and through inverter 138 disables NAND 112. However, grounded contactor 136 contacting either terminal 133 or 134 will result in the disabling of NAND 110 and the enabling of NAND 112. Thus, in normal operation, either gate 110 or 112 supplied its counting pulses through NAND 116 to channel counters 57 and the speed is dependent upon the pressure applied to switch 130. NAND 114 is also responsive to the signal from the last flip/flop of dividing circuit 102 to insure the proper timing relationship among all of the counting pulses.

With terminal 122 of switch 120 at 1 level (operate mode) NAND 114 is enabled to respond to a 0 level signal at the output of inverter 172 to terminate supplying counting pulses through NAND 116 which, as will be explained later, corresponds to detecting a preselected channel.

Although NAND's 110 and 112 are enabled only in the alternative NAND 114 is enabled simultaneously with NAND 112 or NAND 110. In the operate mode, a 1 level at the output of inverter 172 enables NAND 114 to provide a train of counting pulses during the normal half cycle of the 8Hz pulse counting frequency. This operates as an override to provide very rapid (2KHz) advancement of the channel counters. The approximate 2KHz was chosen to provide counting through all possible channels during the half period of the 8Hz pulse frequency. Thus if only 1 channel has been preselected then the system will advance through all possible channels and arrive again at the single preselected number. The circuit functions to rapidly skip all non-preselected channel numbers until it reaches another preselected channel number.

Units counter 175 and tens counter 177 are well known four stage binary counters interconnected to provide clocking for two digit channel numbers. The output of NAND 116 provides pulses to the counters which advance on each positive going edge. In the actual embodiment of the tuning system incorporating the invention, an up/down decade counter with preset terminals such as MCM 14516 is used. The preset feature of the up/down counter is incorporated to permit the inclusion of an external keyboard as shown by reference number 43 as an option in FIG. 1. The use of such a keyboard could force the establishment of a particular binary state into the counters thus causing tuning to a specific channel rather than automatically generating sequential channel numbers. As stated earlier, NAND 140 and 142 are coupled to form an RS flip/flop with the output of NAND 140 coupled to the U/D terminals of units counter 175 and tens counter 177, with a 1 corresponding to counting up and 0 corresponding to counting down.

At the outputs of channel counters 175 and 177 are standard binary encoded representation of the channel number digits. Display decoders 178 and 182 comprise circuitry for identifying the corresponding binary encoded units and tens digits and convert these into appropriate signals for a visual representation of the digits in display devices 180 and 184. In the preferred embodiment the display decoder is a BCD/7 segment device such as a MCM 14511 and the corresponding display devices are seven segment displays such as HP 7651 (LED). When the described devices are suitably connected the generated channel numbers can be visually displayed. The binary encoded outputs of channel counters 175 and 177 are also supplied to comparator 51B and 51A respectively. This portion of the comparator compares the derived channel number with the now generated channel number to control system tuning.

The binary encoded outputs of channel counters 175 and 177 are additionally supplied to read/write memory 81. In the preferred embodiment this memory is a 256 × 1 RAM (random access memory) of which 82 addressable locations are utilized. Such memories include decoding circuitry to convert binary encoded inputs to access unique locations. In the preferred embodiment a memory such as a CD 4061 is used.

When switch 120 is in the program mode, momentary contact switch 152 permits a viewer to preselect a given channel. The terminals of switch 152 are labeled preselect and erase. The erase terminal 154 is employed to remove a previously placed preselect signal at a location. Grounded contactor 155 contacting terminal 153 corresponds to preselecting a channel number corresponding to a unique address memory in 200. A 1 level signal is stored at that corresponding location. Similarly, grounded contactor 155 contacting terminal 154 places a 0 at the corresponding location. Data entry logic selector circuit 82 is the source for the signals to be placed in read/write memory 81. NAND's 160 and 162 are coupled as an RS flip/flop and a 0 level at terminal 153 causes the output of NAND 160 to be at 1 which corresponds to preselecting a given channel number. Similarly, a 0 level signal at terminal 154 causes the output of NAND 160 to be at 0 (erase).

Both inputs of NAND 164 are normally at 1 thus insuring that normally its output is at 0. With switch 120 in program mode the first input of NAND 150 is at 1 and when grounded contactor 155 contacts within terminal 153 or 154, the normally 0 output at NAND 164 becomes 1 for as long as contact is maintained. Since both inputs of NAND 150 are at 1 its output is 0 while the output of inverter 166 goes to 1. It is this positive going edge (from 0 to 1), resulting from activation of momentary switch 152, which causes storage of a signal corresponding to the logic state represented by the output of NAND 160 into the unique location which has been addressed by units and tens channel counters 175 and 177. In the operate mode the effect of momentary switch 152 is disabled since NAND 150 is inhibited to prevent any writing into memory. Thus, nothing can be changed in the memory wherein the system is in the operate mode.

In response to interrogation, a data output terminal of memory 81 supplies logic levels of the memory at the addressed location. As stated earlier, a 1 level corresponds to having preselected a corresponding channel number while a 0 indicates no preselection. This data output terminal is coupled to a display means which may comprise of a non-inverting buffer amplifier coupled to an ordinary LED which is connected through a resistor to ground. It will be appreciated that many forms of display units may be used which respond to a 1 level corresponding to a preselected channel by giving some type of visual indication.

The data output terminal of read/write memory 200 is also coupled through inverter 172 to an input of NAND 114. A 1 level at an addressable location produces a 0 level at the output of NAND 172 thus interrupting the very fast (approximate 2KHz) channel counting by channel counters 175 and 177. A 0 level at an addressable location produces a 1 level at the output of inverter 172 which enables NAND 114 to provide the 2KHz counting rate for rapid channel advancement. It should again be appreciated that NAND 114 is only enabled in the operate mode and, therefore, can not provide the rapid channel advancement when preselecting channel numbers in the program mode.

Activation of momentary switch 130 establishes counting at 2 or 8Hz frequencies and once established it continues until the switch is released, thereby, forcing presets into dividing circuits 102 and 104 to disable their operation. If the switch is maintained in contact, the channel counters are not stopped but rather are advanced at 2 or 8Hz so that the viewer may observe the generated channel numbers and react. Now the very rapid channel number advancement provided through enabling NAND 114 allows shipping through non-preselected channels while selected channels can be displayed for some convenient period. Although display devices 180 and 184 operate constantly there is no perceptable display during the rapid advancement. Continued activation of momentary switch 130 will cause continued advancement to the next preselected channel which will be displayed for a period of time and again the system will very rapidly advance to the next preselected channel.

What has been shown is a television tuning system which sequentially generates channel numbers to provide tuning to corresponding channels. In a system program mode a memory is accessible for storing signals related to preselecting channel numbers. In the operate mode the sequential generation of channel numbers is quite rapid for non-selected channels interrupted whenever a preselected channel number is generated. This system has the advantages of providing all channel tuning without requiring information from a viewer along with an easy and convenient tuning only to desired channels.

I claim:

1. An all electronic television tuning system having a program mode for sequentially tuning to all channels in the discontinuous television frequency band and an operate mode for sequentially tuning to only preselected desired channels, tuning in both modes being accomplished by deriving FCC allocated channel numbers based upon the local oscillator frequency and responding to differences between derived channel numbers and generated channel numbers for adjusting the oscillator frequency to change system tuning as a function thereof, including:

a counter for generating sequential two digit channel numbers for all said television channels;

a two digit indicator communicating to a viewer the channel number corresponding to system tuning;

a memory coupled to said counter and having individual storage locations addressable in said program mode by said channel numbers for storing signals identifying desired channel numbers; and stopping means connected between said counter and said memory for interrupting the generation of sequential two digit channel numbers in said operate mode whenever a generated channel number addresses a storage location at which an identifying signal is stored.

2. The television tuning system of claim 1 wherein said memory individual storage locations each have capacity for storing a single binary digit.

3. The television tuning system of claim 2 further including sequencing logic circuitry coupled to said counter for generating clock pulses to sequence said counter.

4. The television tuning system of claim 3 wherein said sequencing logic circuitry further includes a series of interconnected flip/flops for dividing down a clock signal and generating clock pulses at predetermined intervals to advance said counter.

* * * * *